(12) United States Patent
Thomas et al.

(10) Patent No.: US 6,603,192 B2
(45) Date of Patent: Aug. 5, 2003

(54) SCRATCH RESISTANCE IMPROVEMENT BY FILLING METAL GAPS

(75) Inventors: Danielle A. Thomas, Dallas, TX (US); Harry Michael Siegel, Hurst, TX (US)

(73) Assignee: STMicroelectronics, Inc., Carrollton, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/364,307

(22) Filed: Jul. 30, 1999

(65) Prior Publication Data

US 2003/0071287 A1 Apr. 17, 2003

(51) Int. Cl.[7] .............................................. H01L 23/58
(52) U.S. Cl. ........................ 257/635; 257/641; 438/763
(58) Field of Search ................................ 257/635, 640, 257/641, 644, 414; 438/763

(56) References Cited

U.S. PATENT DOCUMENTS

| | | | |
|---|---|---|---|
| 4,353,056 A | 10/1982 | Tsikos | 340/146 |
| 4,523,975 A * | 6/1985 | Groves et al. | 257/635 |
| 4,872,947 A | 10/1989 | Wang et al. | 156/643 |
| 5,325,442 A | 6/1994 | Knapp | 382/4 |
| 6,091,082 A * | 7/2000 | Thomas et al. | 257/77 |
| 6,180,989 B1 * | 1/2001 | Bryant et al. | 257/414 |
| 6,423,995 B1 * | 7/2002 | Thomas | 257/296 |
| 2001/0019168 A1 * | 9/2001 | Willer et al. | 257/639 |

FOREIGN PATENT DOCUMENTS

| | | |
|---|---|---|
| EP | 0 789 334 | 8/1997 |
| EP | 1 017 009 | 7/2000 |
| EP | 1 018 698 | 12/2000 |
| WO | WO 00/03345 | 1/2000 |
| WO | WO 01/06448 | 1/2001 |

OTHER PUBLICATIONS

Tartagni, et al, "A 390 dpi Live Fingerprint Imager Based on Feedback Capacitive Sensing Scheme", 1997 IEEE International Solid–State Circuits Conference, 1997.
R.F. Wolffenbuttel and P.O.L. Regtien, "Integrated Tactile Imager with an Intrinsic Contour Detection Option", *Sensor and Actuators*, Jan./Feb. 1989, No. 1/2, pp. 141–153.
N.D. Young, et al., "Novel Fingerprint Scanning Arrays Using Polysilicon TFT's of Glass and Polymer Substrates", IEEE Electron Device Letters, V. 18, No. 1, Jan., 1997, pp. 19–20.

* cited by examiner

Primary Examiner—Mark V. Prenty
(74) Attorney, Agent, or Firm—Lisa K. Jorgenson; William A. Munck

(57) ABSTRACT

Passivation for capacitive sensor circuits, which overlies the capacitive sensor electrodes and is normally conformal to the electrodes and the underlying interlevel dielectric, is planarized by forming a layer of flowable oxide over the electrodes before forming the passivation. The flowable oxide, which is preferably very thin over the electrodes to minimize loss of sensitivity, provides a substantially planar upper surface, so that passivation formed on the flowable oxide is also substantially planar. Alternatively, a deposited oxide planarized by chemical mechanical polishing may be employed to planarize the surface on which a passivation stack is formed. The planarized passivation provides markedly improved scratch resistance.

26 Claims, 8 Drawing Sheets

SCRATCH RESISTANCE IMPROVEMENT BY FILLING METAL GAPS

RELATED APPLICATION

The present invention is related to the subject matter of commonly assigned, copending U.S. patent applications Ser. No. 09/360,839 entitled "SCRATCH RESISTANCE FOR DIRECT CONTACT SENSORS" and filed Jul. 26, 1999. The content of the above-referenced application is incorporated herein by reference.

BACKGROUND OF THE INVENTION

1. Field of the Invention

The present invention relates generally to scratch protection for integrated sensor circuits, and more specifically to improvement of scratch protection in capacitive sensor circuits through planarization of passivation overlying capacitive sensor electrodes.

2. Description of the Prior Art

Fingerprint acquisition circuits employ arrays of sensors coated with a dielectric onto which the finger is placed with the epidermis in contact with the dielectric. The ridges and grooves on the epidermal layer of the finger are then detected by the sensors, which transmit signals representative of the detected pattern. Although various sensors are possible (e.g., resistive, etc.), capacitive sensors have been found to provide the best performance and security. Since capacitance between two capacitive plates is inversely proportional to the distance between the plates, using the contacting dermal tissue itself as one capacitor plate and the sensor electrode as the other and then determining capacitance for each sensor electrode in the array, it is possible to locate the ridges and grooves of the fingerprint.

Such capacitive sensors cannot be mechanically protected because physical contact on the surface of the integrated circuit with the finger is necessary. However, some scratch resistance protection for the capacitive sensor electrodes is required to prevent "scratch" damage to the sensor electrodes. Such damage typically results from undue (and unnecessary) pressure on the surface of the integrated circuit, alone or in combination with some sharp edge or protrusion such as a callous or scar, fingernail, rings, dust or dirt particle, etc. While extremely hard passivation stacks employing silicon carbide (SiC) have been developed for these circuits, the capacitive electrodes may still become very badly damaged through use.

It would be desirable, therefore, to improve the scratch resistance of passivation employed in capacitive sensor circuits.

SUMMARY OF THE INVENTION

Passivation for capacitive sensor circuits, which overlies the capacitive sensor electrodes and is normally conformal to the electrodes and the underlying interlevel dielectric, is planarized by forming a layer of flowable oxide over the electrodes before forming the passivation. The flowable oxide, which is preferably very thin over the electrodes to minimize loss of sensitivity, provides a substantially planar upper surface, so that passivation formed on the flowable oxide is also substantially planar. Alternatively, a deposited oxide planarized by chemical mechanical polishing may be employed to planarize the surface on which a passivation stack is formed. The planarized passivation provides markedly improved scratch resistance.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

The following description details the structure, application and features of the present invention, but it will be understood by those of skill in the art that the scope of the invention is defined only by the issued claims, and not by any description herein. The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1A:
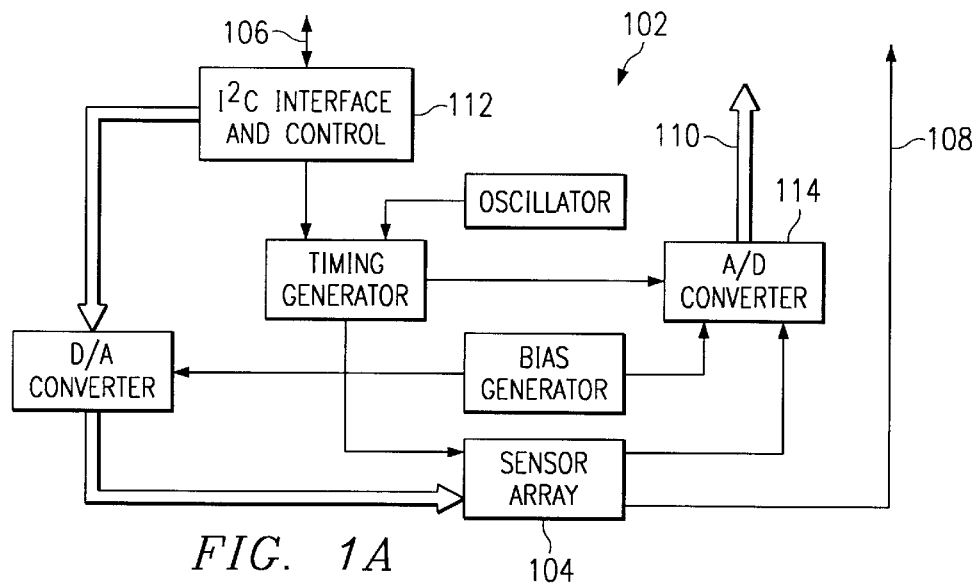
FIGS. 1A–1B depict various views of a sensor circuit employing scratch resistance in accordance with a preferred embodiment of the present invention.
Figure 1B:
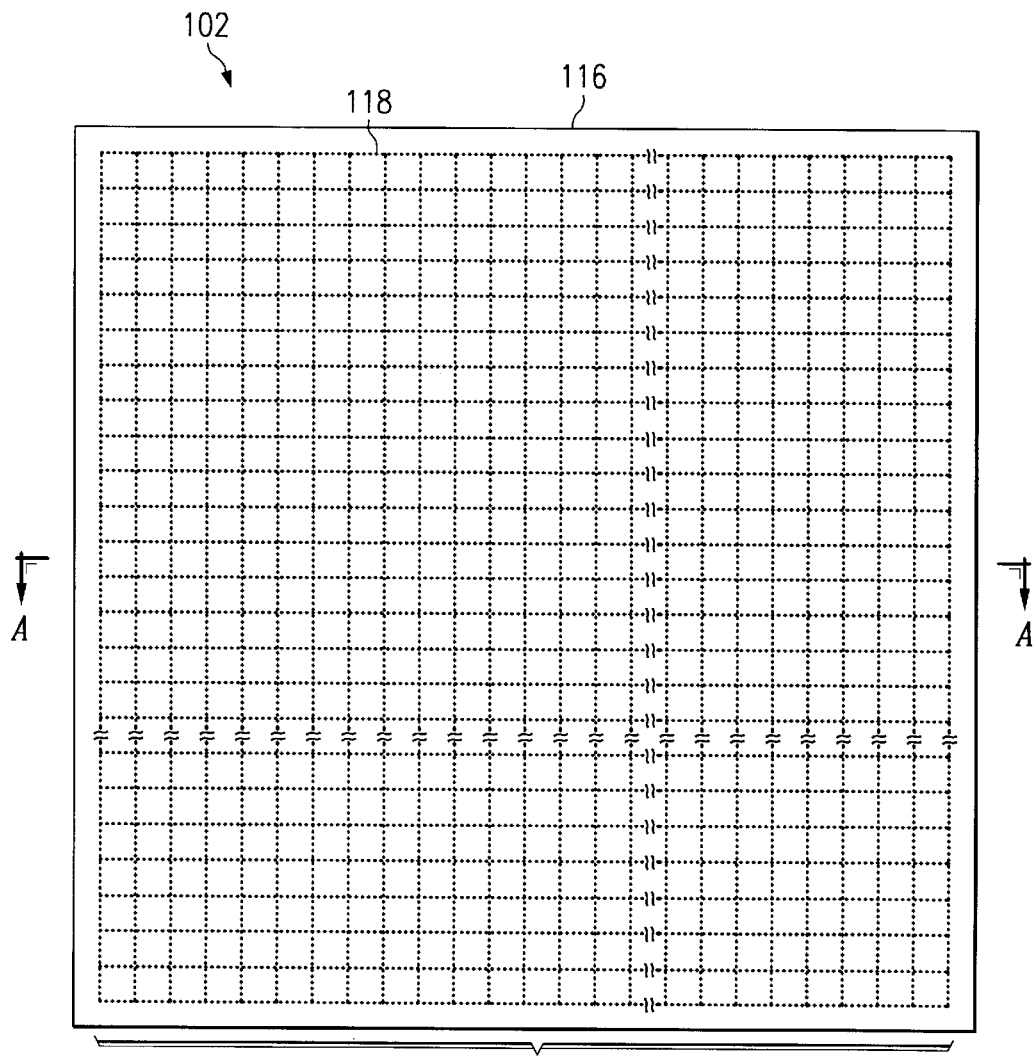

With reference now to the figures, and in particular with reference to FIGS. 1A 1B, various views of a sensor circuit employing scratch resistance in accordance with a preferred embodiment of the present invention are depicted. FIG. 1A depicts a block diagram of the sensor circuit 102, which is formed as an integrated circuit on a single die. The sensor circuit 102 and its operation are described more fully in commonly assigned, copending application Ser. No. 09/040, 261, entitled "CAPACITIVE DISTANCE SENSOR" and filed May 9, 1998, which is incorporated herein by reference.

The portions of sensor circuit 102 relevant to the present invention include an array 104 of capacitive sensors for fingerprint acquisition by sensing distances between capacitive electrodes within the sensor array 104 and ridges and grooves on a finger placed in contact with sensor array 104. Sensor circuit 102 also includes signal lines 106 and 108 and output bus 110. Signal line 106 connects $I^2C$ interface and control device 112, which provides a bidirectional communication protocol enabling sensor circuit 102 to communicate with a controller such as a microcontroller, with controller circuitry (not shown) external to sensor circuit 102. Signal line 108 is a synchronization line coupling sensor array 104 to the external controller circuit, providing synchronization signals allowing detected voltages representative of the capacitive value of individual capacitive electrodes within sensor array 104, and therefore representative of the distance between the capacitive electrode and the portion of the epidermal layer contacting sensor array 104 in the region of the capacitive electrode, to be properly interpreted by the external controller. Output bus 110 couples an analog-to-digital (A/D) converter 114 to the external controller. A/D converter 114 processes analog voltage measurements received from sensor array 104 and generates digital representations recognized by the external controller as distance measurements of the analog measured voltages from individual capacitive electrodes within sensor array 104. A/D converter 114 transmits these digital signals to the external controller on output bus 110.

FIG. 1B is a pictorial representation of the "front" side of sensor circuit 102; that is, FIG. 1B depicts the major surface of the die 116 on which the active devices constituting sensor circuit 102 are formed. Sensor array 104 is located on the front side of die 116 and includes a plurality of cells 118, each containing one or more capacitive electrodes. Sensor array 104 in the exemplary embodiment contains square cells approximately 45–50 $\mu$m on a side, forming a 250×350 array of contiguous cells 118 within sensor array 104. Sensor array 104 is covered by a passivation material overlying the capacitive electrodes within each cell 118. Other active devices required to form sensor circuit 102 are formed below the capacitive electrodes.

Figure 2A:
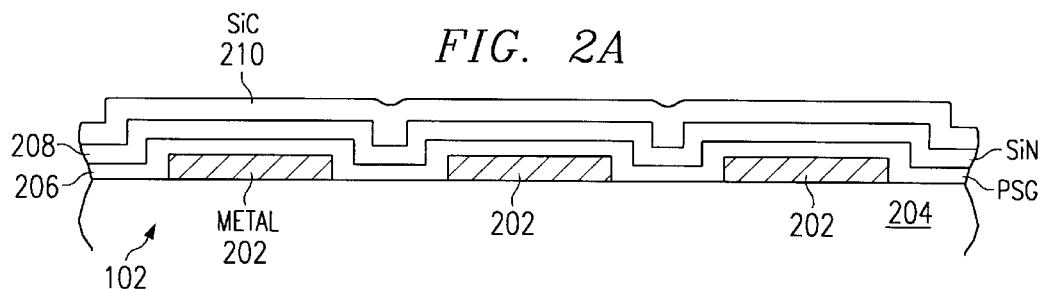
FIGS. 2A–2C are cross-sectional details of a sensor circuit in accordance with the known art and in accordance with a preferred embodiment of the present invention.
Figure 2B:
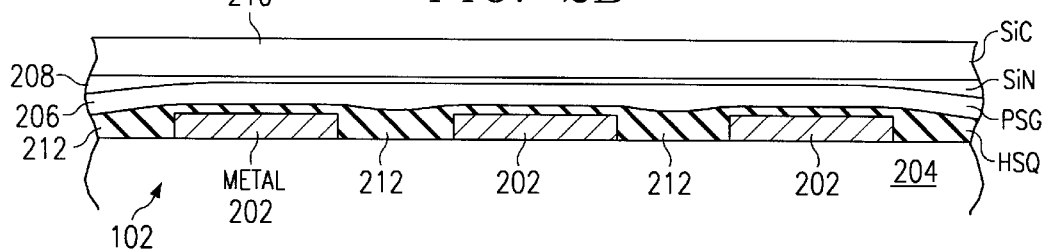
Figure 2C:
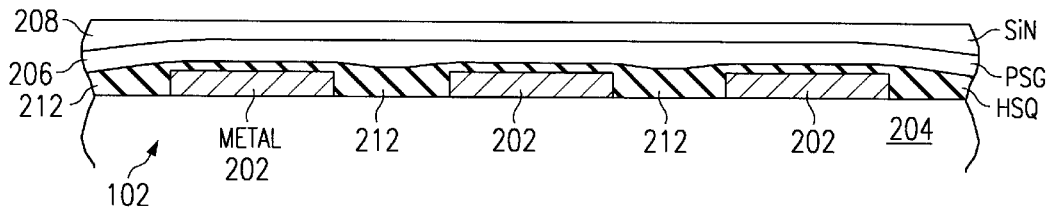

Referring to FIGS. 2A through 2C, cross-sectional details of a sensor circuit in accordance with the known art and in accordance with a preferred embodiment of the present invention are illustrated. The details illustrated are from cross-sections taken at section line A—A in FIG. 1B. FIG. 2A illustrates sensor circuit passivation in accordance with the known art. Sensor circuit 102 includes metal electrodes 202 for the capacitive sensors overlying an interlevel dielectric 204, such as an oxide. Passivation formed over capacitive metal electrodes 202 includes phosphosilicate glass (PSG) layer 206, silicon nitride (SiN) layer 208, and silicon carbide (SiC) layer 210, which together form the passivation for sensor circuit 102. As illustrated, the passivation layers 206, 208 and 210 are conventionally formed conformally over electrodes 202 and dielectric 204. This structure has been found to provide less than completely satisfactory scratch resistance, even when tungsten electrostatic discharge (ESD) protection patterns and/or capacitive electrodes are employed.

FIG. 2B illustrates sensor circuit passivation in accordance with the present invention. Scratch resistance is improved by filling the spaces between the metal electrodes 202 to prevent these electrodes from crushing under pressure. However, the sensitivity of the capacitive cells within sensor circuit 102 should not be degraded, which means that the capacitance should not be significantly reduced by additional dielectric thickness between the capacitive electrodes 202 and the finger or by introduction of materials with a high dielectric constant. In the present invention, therefore, a hydrogen silsesquioxane (HSQ) layer 212 is formed over the interlevel dielectric 204 and capacitive metal electrodes 202 before forming the passivation.

HSQ (also referred to as "flowable oxide") layer 212 may be formed according to known processes and exhibits a very high planarization, greater than 90% planar at spacings of 5 $\mu$m or less. HSQ also has excellent gap filling capabilities, down to 0.1 $\mu$m spaces, and a low dielectric constant (less than 3). Thus HSQ layer 212 should not significantly degrade the sensitivity of sensor circuit 102. HSQ layer 212 is formed very thin over capacitive electrodes 202, with less than the thickness of capacitive electrodes 202 (approximately 1 $\mu$m thick) overlying the capacitive electrodes 202. The thickness of HSQ layer 212 in regions adjacent to capacitive electrodes 202 is thus preferably only slightly thicker than the capacitive electrodes 202 themselves.

HSQ layer 212 provides a substantially planar upper surface, on which is formed the passivation: PSG layer 206 to a thickness of approximately 5,000 Å; SiN layer 208 to a thickness of approximately 5,000 Å; and SiC layer 210 to a thickness of approximately 2,500 Å. PSG layer 206 may be formed before HSQ layer 212, but is preferably formed over HSQ layer 212 since the interface between HSQ and nitride is weaker. Alternatively, oxide may be deposited in lieu of (or in addition to) HSQ layer 212, and planarized utilizing a planarizing etch-back, such as chemical mechanical polishing (CMP). FIG. 2C illustrates sensor circuit passivation in accordance with an alternative embodiment of the present invention, in which SiC layer 210 is omitted.

Figure 3A:
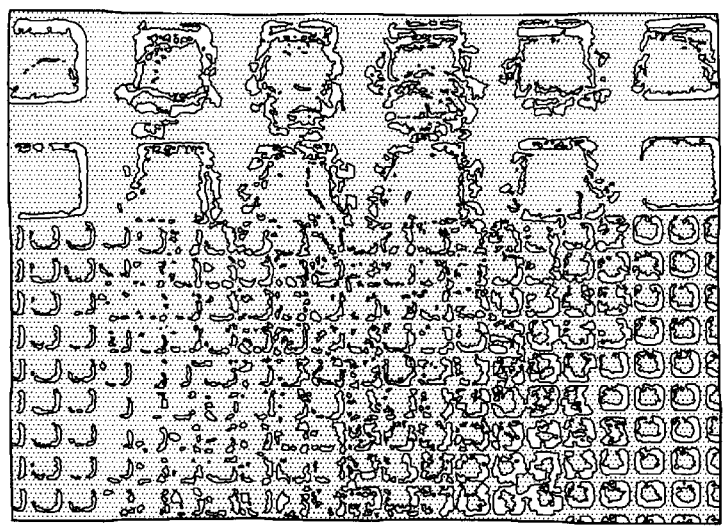
FIGS. 3A–3F depict results of micro scratch testing for sensor circuits in accordance with the known art and in accordance with a preferred embodiment of the present invention.
Figure 3A:
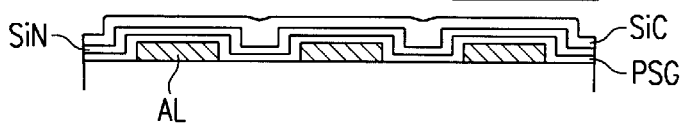

With reference now to FIGS. 3A through 3F, results of micro scratch testing for sensor circuits passivated in accordance with the known art and in accordance with a preferred embodiment of the present invention are depicted. In FIG. 3A, test structures passivated with conformal PSG, SiN and SiC layers in accordance with the known art were subject to a 2 N force by a 1 mm steel stylus are seen to be damaged. Sensor circuits passivated in this manner are known to scratch easily, and may be rendered inoperative by a 1 N force applied by a 0.5 mm diamond pin.

Figure 3B:
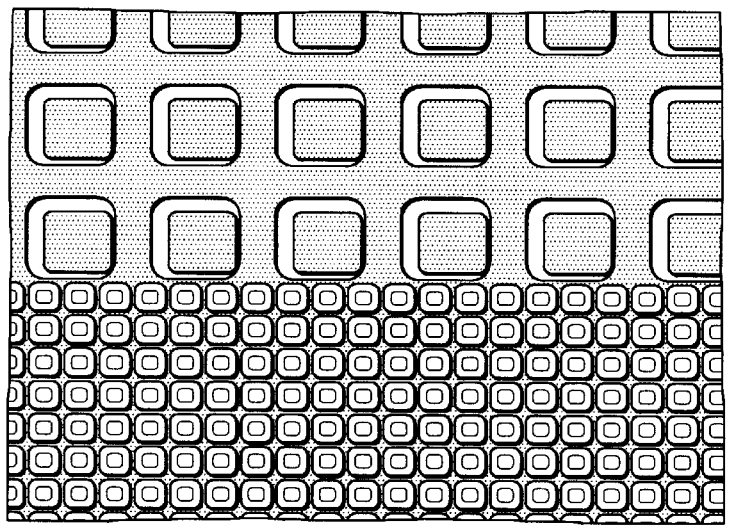
Figure 3B:
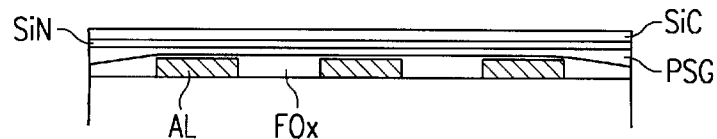
Figure 3C:
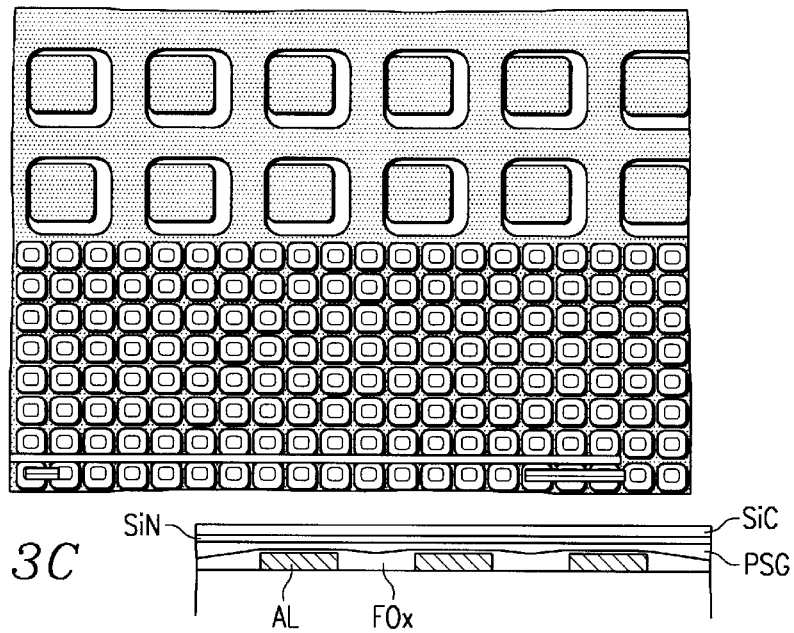

FIGS. 3B and 3C illustrate the effect of the same 2 N force applied by a 1 mm steel stylus on test structures passivated with a planarizing layer of flowable oxide in accordance with the present invention. FIG. 3B illustrates the result when a SiC layer is employed, while FIG. 3C illustrates the result without an SiC layer. As shown, no damage is detectable.

Figure 3D:
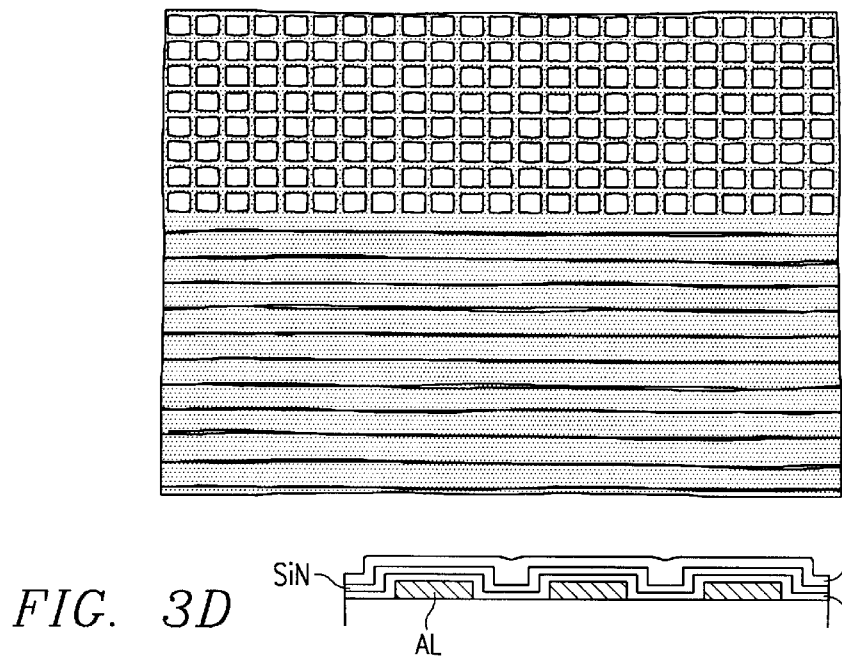
Figure 3E:
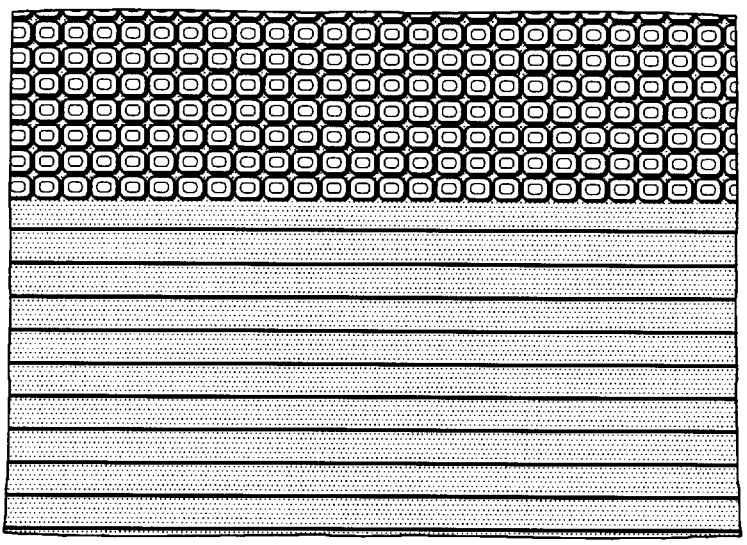
Figure 3E:
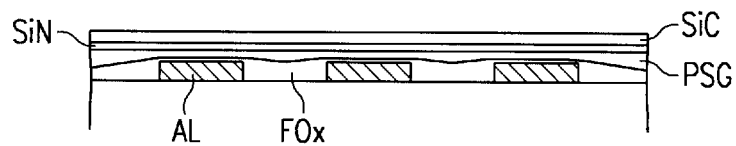
Figure 3F:
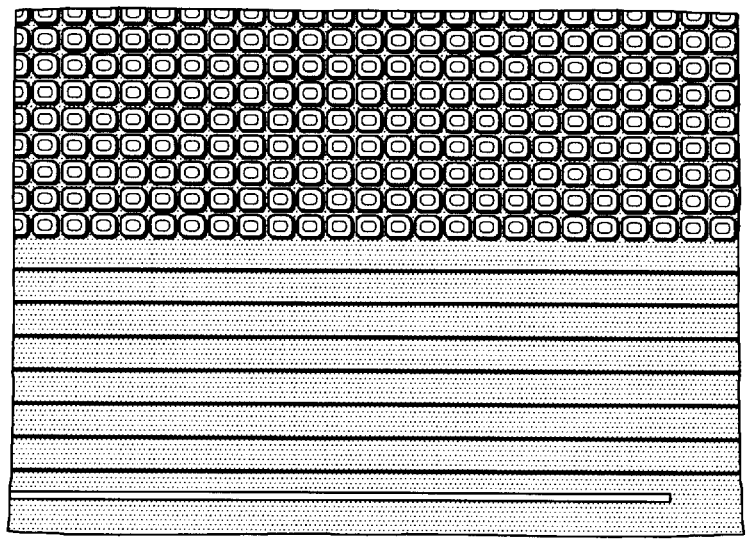
Figure 3F:
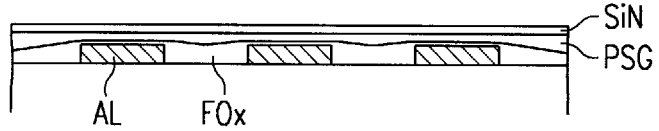

FIGS. 3D through 3F illustrate similar testing as that for FIGS. 3A through 3C, but with a 5 N force applied by the 1 mm steel stylus. Again, the test structures passivated in the conventional manner were destroyed, as shown in FIG. 3D. Test structures passivated with a planarizing FOX layer exhibited no appreciable damage when a silicon carbide layer was employed, as shown in FIG. 3E, and only very minimal damage without the silicon carbide layer, as shown in FIG. 3F.

Referring to FIGS. 4A through 4F, a series of cross-sections for a process of fabricating a sensor circuit in accordance with a preferred embodiment of the present invention are illustrated. The process begins with the sensor circuit fabricated to the point of having formed capacitive electrodes 402 connected to underlying conductive polysilicon structures 404, which may be gate electrodes, source/drain contacts, or interconnects, through an interlevel dielectric 406 and a lower dielectric layer 408. Cross-sections from the sensor array area 410, the peripheral area 412, and the pad area 414 of the sensor circuit are depicted. Contacts 416 for ESD protection lines and die contact pads 418 are formed within the peripheral area 412 and the pad area 414, respectively.

Figure 4A:
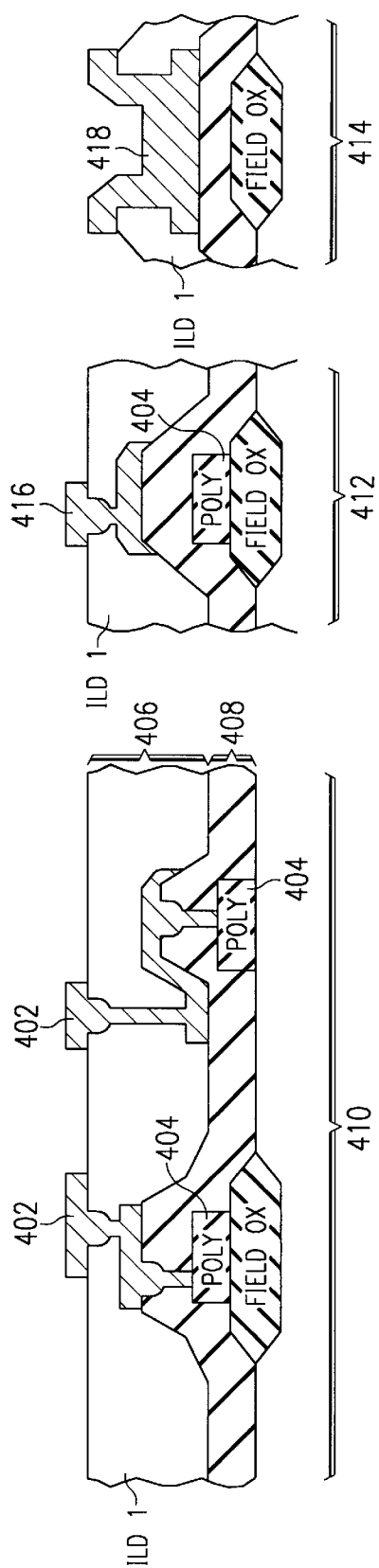
FIGS. 4A–4F are a series of cross-sections for a process of fabricating a sensor circuit in accordance with a preferred embodiment of the present invention.
Figure 4B:
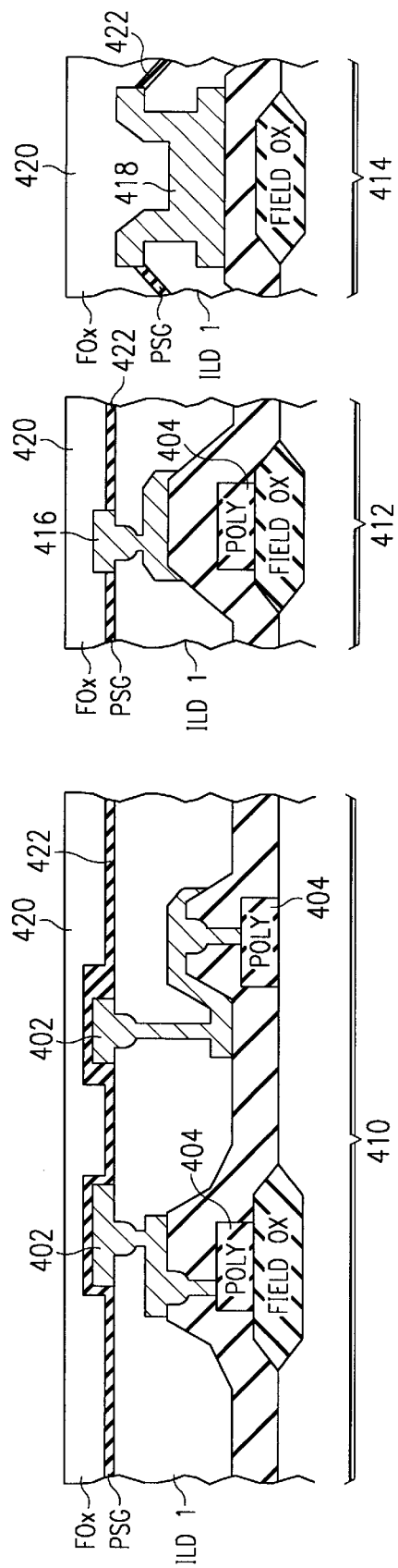
Figure 4C:
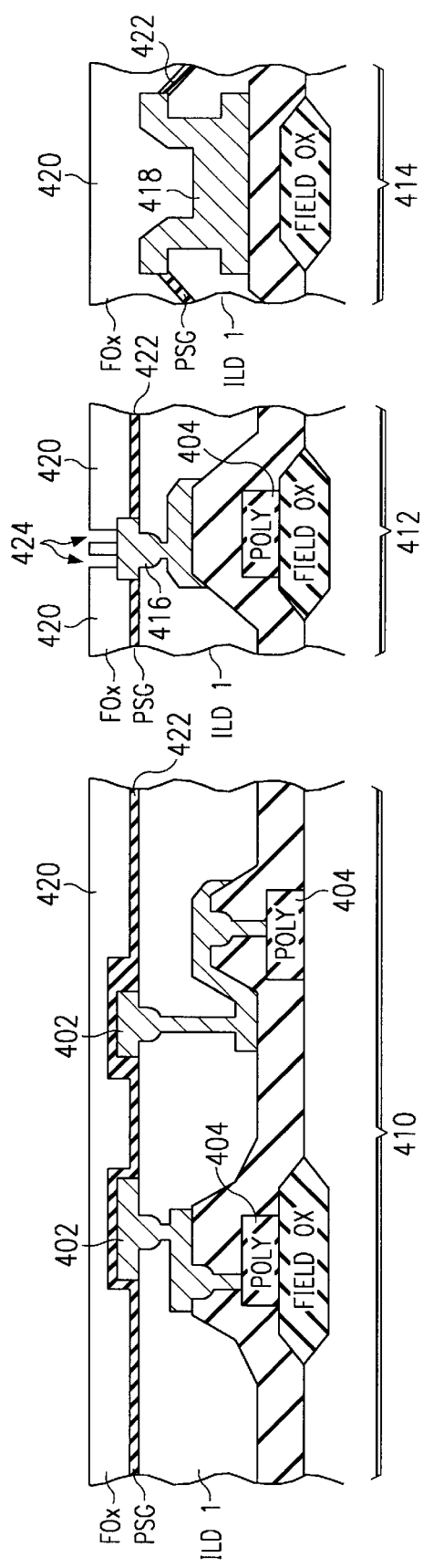
Figure 4D:
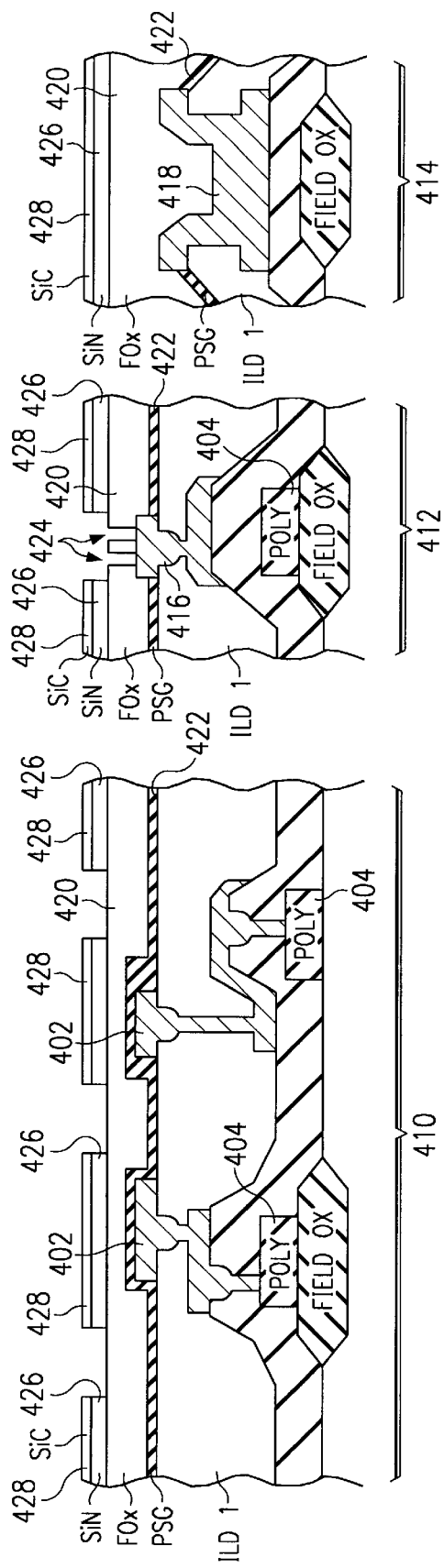
Figure 4E:
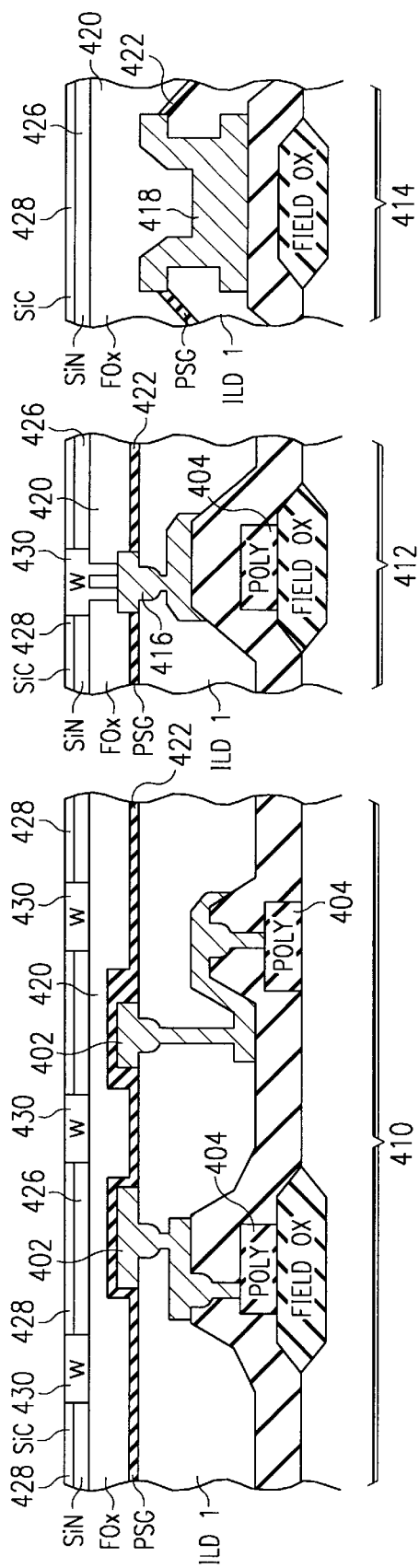
Figure 4F:
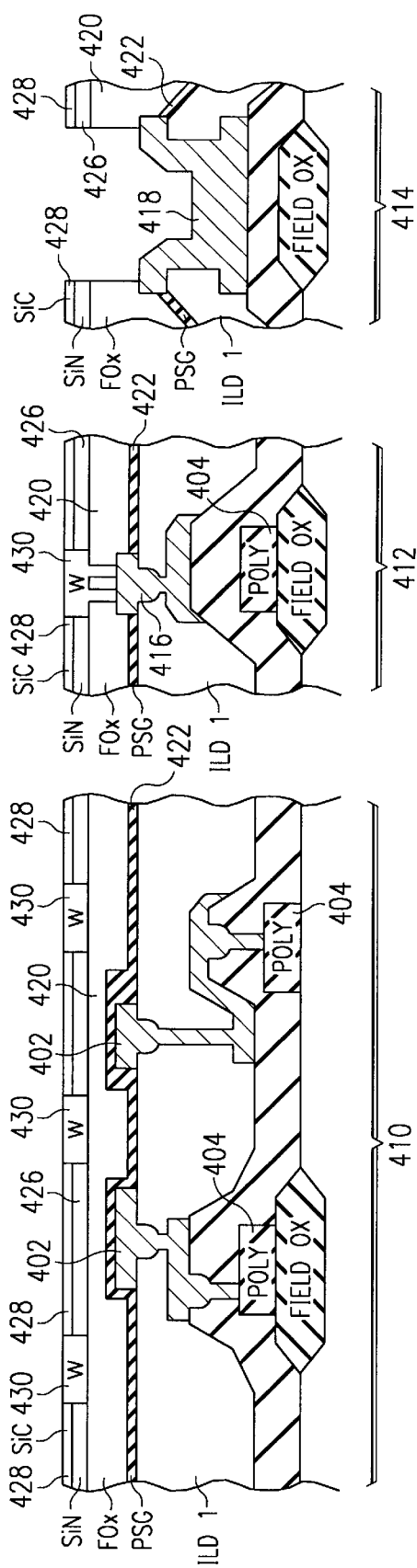

A flowable oxide layer 420 and a PSG layer 422 are then formed over all areas 410, 412, and 414, as shown in FIG. 4B. In the example shown, PSG layer 422 is formed beneath flowable oxide 420, although the opposite order is preferred for the reasons described above. Vias 424 for the connections to ESD protection lines are then etched as illustrated in FIG. 4C, and silicon nitride layer 426 and silicon carbide layer 428 are deposited and patterned for the ESD protection grid as shown in FIG. 4D. A tungsten layer is then formed and etched back to form ESD protection lines and connections 430 as illustrated in FIG. 4E, and an opening to pad 418 is etched as shown in FIG. 4F.

The present invention improves scratch resistance for a capacitive sensor circuit simply by planarizing the passivation, without significantly diminishing the sensitivity of the sensor circuit. The spaces between capacitive electrodes at the surface of the sensor circuit, immediately below the passivation, are filled with flowable oxide, with only a very thin layer of flowable oxide formed over the capacitive electrodes themselves, resulting in a planar surface for formation of the passivation layers. The planarized passivation provides uniform boundaries for force applied to the surface of the sensor circuit, substantially improving scratch resistance for the circuit.

While the invention has been particularly shown and described with reference to a preferred embodiment, it will be understood by those skilled in the art that various changes in form and detail may be made therein without departing from the spirit and scope of the invention.

What is claimed is:

1. An integrated circuit structure, comprising:
    a dielectric layer;
    a plurality of capacitive electrodes overlying the dielectric layer and forming an array of sensors for capacitive coupling to an item placed proximate to the capacitive electrodes;
    a layer of oxide overlying the capacitive electrodes and portions of the dielectric layer between the capacitive electrodes, the oxide having a substantially planar upper surface; and
    passivation overlying the oxide.

2. The integrated circuit structure of claim 1, wherein oxide is HSQ.

3. The integrated circuit structure of claim 1, wherein the oxide is deposited oxide planarized by chemical mechanical polishing.

4. The integrated circuit structure of claim 1, wherein the oxide has a thickness equal to or greater than a thickness of the capacitive electrodes.

5. The integrated circuit structure of claim 1, wherein the oxide is on the capacitive electrodes and the dielectric between the capacitive electrodes, wherein a portion of the oxide over the capacitive electrodes has a thickness less than a thickness of the capacitive electrodes.

6. The integrated circuit structure of claim 5, wherein the passivation is on the oxide.

7. The integrated circuit structure of claim 1, further comprising:
    electrostatic discharge protection within the passivation.

8. The integrated circuit structure of claim 1, wherein the plurality of capacitive electrodes form an array for fingerprint detection, each capacitive electrode connected to an active device underlying the dielectric.

9. The integrated circuit structure of claim 1, further comprising:
    a PSG layer between the oxide and the passivation.

10. The integrated circuit structure of claim 1, further comprising:
    a PSG layer between the dielectric and the oxide.

11. The integrated circuit structure of claim 1, wherein the passivation further comprises:
    a silicon nitride layer; and
    a silicon carbide layer.

12. A method of improving scratch resistance, comprising:
    forming a dielectric layer;
    forming a plurality of capacitive electrodes overlying the dielectric layer;
    forming a layer of oxide overlying the capacitive electrodes and the dielectric layer between the capacitive electrodes, the oxide having a substantially planar upper surface; and
    forming passivation overlying the oxide.

13. The method of claim 12, wherein forming a layer of oxide overlying the capacitive electrodes and the dielectric layer between the capacitive electrodes further comprises:
    forming the oxide from HSQ.

14. The method of claim 12, wherein forming a layer of oxide overlying the capacitive electrodes and the dielectric layer between the capacitive electrodes further comprises:
    depositing the oxide; and
    planarizing the oxide by chemical mechanical polishing.

15. The method of claim 12, wherein forming a layer of oxide overlying the capacitive electrodes and the dielectric layer between the capacitive electrodes further comprises:
    forming the oxide with a thickness equal to or greater than a thickness of the capacitive electrodes.

16. The method of claim 12, wherein forming a layer of oxide overlying the capacitive electrodes and the dielectric layer between the capacitive electrodes further comprises:
    forming the oxide on the capacitive electrodes and the dielectric between the capacitive electrodes.

17. The method of claim 16, wherein forming passivation overlying the oxide further comprises:
    forming the passivation on the oxide.

18. The method of claim 12, further comprising:
    forming electrostatic discharge protection within the passivation.

19. The method of claim 12, wherein forming a plurality of capacitive electrodes overlying the dielectric layer further comprises:
    forming the plurality of capacitive electrodes in an array for fingerprint detection, each capacitive electrode connected to an active device underlying the dielectric.

20. The method of claim 12, further comprising:
    forming a PSG layer between the oxide and the passivation.

21. The method of claim 12, further comprising:
    forming a PSG layer between the dielectric and the oxide.

22. The method of claim 12, wherein forming passivation overlying the oxide further comprises:
    forming a silicon nitride layer; and
    forming a silicon carbide layer.

23. Scratch resistant integrated circuit protection for an array of capacitive electrodes, comprising:
    an oxide on the capacitive electrodes and between the capacitive electrodes, the oxide having a substantially planar upper surface;
    a silicon nitride layer over the oxide, the silicon nitride layer having a substantially planar upper surface; and
    a silicon carbide layer on the silicon nitride layer, the silicon carbide layer having a substantially planar upper surface.

24. The scratch resistant integrated circuit protection of claim 23, wherein the oxide is a flowable oxide.

25. The scratch resistant integrated circuit protection of claim 23, wherein the oxide is a planarized, deposited oxide.

26. The scratch resistant integrated circuit protection of claim 23, further comprising:
    a PSG layer between the oxide and the silicon nitride layer.

* * * * *